United States Patent
Zhang et al.

(10) Patent No.: US 12,446,311 B2
(45) Date of Patent: Oct. 14, 2025

(54) ARRAY SUBSTRATE AND DISPLAY TERMINAL

(71) Applicant: WUHAN CHINA STAR OPTOELECTRONICS TECHNOLOGY CO., LTD., Hubei (CN)

(72) Inventors: Chi Zhang, Hubei (CN); Yun Xiang, Hubei (CN); Jian Tao, Hubei (CN); Yafeng Li, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 17/622,791

(22) PCT Filed: Dec. 17, 2021

(86) PCT No.: PCT/CN2021/139305
§ 371 (c)(1),
(2) Date: Dec. 24, 2021

(87) PCT Pub. No.: WO2023/108647
PCT Pub. Date: Jun. 22, 2023

(65) Prior Publication Data
US 2024/0038780 A1    Feb. 1, 2024

(30) Foreign Application Priority Data
Dec. 13, 2021  (CN) ..................... 202111522737.6

(51) Int. Cl.
*H01L 27/12* (2006.01)
*H10D 86/40* (2025.01)
*H10D 86/60* (2025.01)

(52) U.S. Cl.
CPC ........... *H10D 86/60* (2025.01); *H10D 86/451* (2025.01); *H10D 86/421* (2025.01)

(58) Field of Classification Search
CPC ............. H01L 27/1248; H01L 27/1222; H01L 27/124; H01L 27/78663
(Continued)

(56) References Cited

U.S. PATENT DOCUMENTS 9,660,090 B2 * 5/2017 Yoon ..................... H01L 27/124
10,909,298 B1 * 2/2021 Chan .................... H01L 27/0207
(Continued)

FOREIGN PATENT DOCUMENTS

| CN | 103268876 A | * | 8/2013 |
| CN | 106252363 A |   | 12/2016 |

(Continued)

OTHER PUBLICATIONS

International Search Report in International application No. PCT/CN2021/139305, mailed on Sep. 21, 2022.
(Continued)

*Primary Examiner* — William C Trapanese
(74) *Attorney, Agent, or Firm* — PV IP PC; Wei Te Chung

(57) ABSTRACT

The present application sets forth an array substrate and a display terminal. The array substrate includes an underlay, a light shielding layer disposed on the underlay, an active layer disposed on the light shielding layer, and a connection element disposed on the active layer. The light shielding layer includes light shielding portions spaced from one another. The active layer includes active portions spaced from one another. The active portions correspond to the light shielding portions. Furthermore, adjacent two active por-
(Continued)

A–A tions are electrically connected through a bridge element. A toughness of the bridge element is greater than a toughness of the active portion.

18 Claims, 3 Drawing Sheets

(58) Field of Classification Search
USPC .................................. 257/72, 89, 347, 390
See application file for complete search history.

(56) References Cited

U.S. PATENT DOCUMENTS

| 2015/0187959 | A1* | 7/2015 | Yoon .............. | H10D 30/6755 |
| | | | | 257/43 |
| 2016/0293884 | A1 | 10/2016 | Zhang et al. | |
| 2019/0131318 | A1 | 5/2019 | Xue et al. | |

FOREIGN PATENT DOCUMENTS

| CN | 208622728 | U | 3/2019 |
| CN | 111524911 | A | 8/2020 |
| CN | 112928127 | A | 6/2021 |
| CN | 113629084 | A | 11/2021 |
| KR | 20160080954 | A | 7/2016 |

OTHER PUBLICATIONS

Written Opinion of the International Search Authority in International application No. PCT/CN2021/139305, mailed on Sep. 21, 2022.

Chinese Office Action issued in corresponding Chinese Patent Application No. 202111522737.6 dated Apr. 27, 2025, pp. 1-7.

* cited by examiner

A-A

A-A

ARRAY SUBSTRATE AND DISPLAY TERMINAL

FIELD OF INVENTION

The present application relates to a field of display technologies, especially to an array substrate and a display terminal.

BACKGROUND OF INVENTION

To mitigate an issue of off-state leakage current of a thin film transistor in a low frequency display, usually two thin film transistors in series connection with an active layer are disposed in a sub-pixel to increase a ratio of channel region to further increase, an impedance value of the thin film transistors. Furthermore, a metal light shielding layer is disposed to shield channel regions of thin film transistors to achieve a goal of reducing an off-state leakage current the thin film transistors.

At present, metal light shielding layers of two thin film transistors in series connection are generally spaced form each other. However, the active layer of two thin film transistors in series connection has climbing in spaced positions of the metal light shielding layer, and the climbing positions easily causes abnormal crystallization or broken parts of the active layer, which results in drastic decrease of an on-state current of a thin film transistor to result in poor display such as dark points.

SUMMARY OF INVENTION

Technical Issue

A technical issue is that at present an active layer with two thin film transistors in series connection has a climbing position on an interval of spaced connection of a metal light shielding layer, and climbing position easily has abnormal crystallization or broken parts of the active layer to result in poor display such as dark points.

Technical Solution

The present application provides an array substrate and display terminal to solve the technical issue of the conventional array substrate has climbing issue on spaced positions of a metal light shielding layer to result in drastic decrease of an on-state current of a thin film transistor to cause poor display such as dark points.

To solve the above technical issue, the present application provides technical solutions as follows:

The present application provides an array substrate, comprising:

an underlay;
a light shielding layer disposed on the underlay, wherein the light shielding layer comprises a plurality of light shielding portions spaced from one another;
an active layer disposed on the light shielding layer, wherein the active layer disposed on a plurality of active portions spaced from one another, the active portions correspond to the light shielding portions; and
a bridge element disposed on the active layer, wherein adjacent two of the active portions are electrically connected to each other through the bridge element, a toughness of the bridge element is greater than a toughness of the active portions.

In the array substrate of the present application, an interval between adjacent two of the active portions connected through the bridge element is 2 microns to 5 microns.

In the array substrate of the present application, an orthographic projection of the active portion on a corresponding one of the light shielding portions is in the light shielding portions.

In the array substrate of the present application, in a top view plane of the array substrate, an interval between an edge of the active portion and an edge of the light shielding portion is 1 micron to 3 microns.

In the array substrate of the present application, in a direction perpendicular to the array substrate, a thickness of the bridge element is greater than a thickness of the light shielding layer.

In the array substrate of the present application, the active portion comprises a channel region and a first doping region and a second doping region located on two sides of the channel region.

In the array substrate of the present application, the bridge element is connected to the first doping region and the second doping region of adjacent two of the active portions.

In the array substrate of the present application, the array substrate further comprises signal lines and a pixel electrode layer disposed on the active layer.

In the array substrate of the present application, the active layer at least comprises a first active portion and a second active portion that are adjacent to each other.

In the array substrate of the present application, the signal line is connected to the first active portion through a via hole.

In the array substrate of the present application, the second active portion is connected to the pixel electrode layer through a via hole.

In the array substrate of the present application, the array substrate further comprises a first source and drain electrode portion disposed on the first doping region of the first active portion.

In the array substrate of the present application, the array substrate further comprises a second source and drain electrode portion disposed on the second doping region of the second active portion.

In the array substrate of the present application, the signal line is connected the first source and drain electrode portion to through a via hole.

In the array substrate of the present application, the bridge element is connected to the second doping region of the first active portion and the first doping region of the second active portion.

In the array substrate of the present application, the array substrate further comprises a gate electrode layer disposed on the active layer.

In the array substrate of the present application, the active portions an orthographic projection of the channel region on the gate electrode layer is located in the gate electrode layer.

In the array substrate of the present application, the array substrate further comprises a gate insulation layer disposed between the active layer and the bridge element.

In the array substrate of the present application, the bridge element is connected to the active layer through a via hole.

The present application also provides a display terminal, the display terminal comprises a terminal main body and the above array substrate, the array substrate and the terminal main body are assembled integrally.

Advantages

The present application disposes a bridge element connected to adjacent two active portions and connects the active portions of adjacent two thin film transistors in series such that a ratio of channel region of two thin film transistors in series connection can be increased to increase an impedance value and reduce an off-state leakage current of the thin film transistor. Furthermore, light shielding portions corresponding to adjacent two of the active portions in the present application are also spaced from one another, which can solve a issue of a large piece of a metal layer resulting in a poor static electricity protection process. Furthermore, in the present application, a toughness of the bridge element is greater than a toughness of the active portions such that the climbing position between adjacent two of the light shielding portions can keep continuous to lower a risk of abnormal crystallization or broken parts of "active layer" of the climbing position to further prevent or mitigate a probability of drastic decrease of an on-state current of the thin film transistor and reduce poor display such as dark points.

DESCRIPTION OF DRAWINGS

To more clearly elaborate on the technical solutions of embodiments of the present invention or prior art, appended figures necessary for describing the embodiments of the present invention or prior art will be briefly introduced as follows. Apparently, the following appended figures are merely some embodiments of the present invention. A person of ordinary skill in the art may acquire other figures according to the appended figures without any creative effort.

Figure 1:
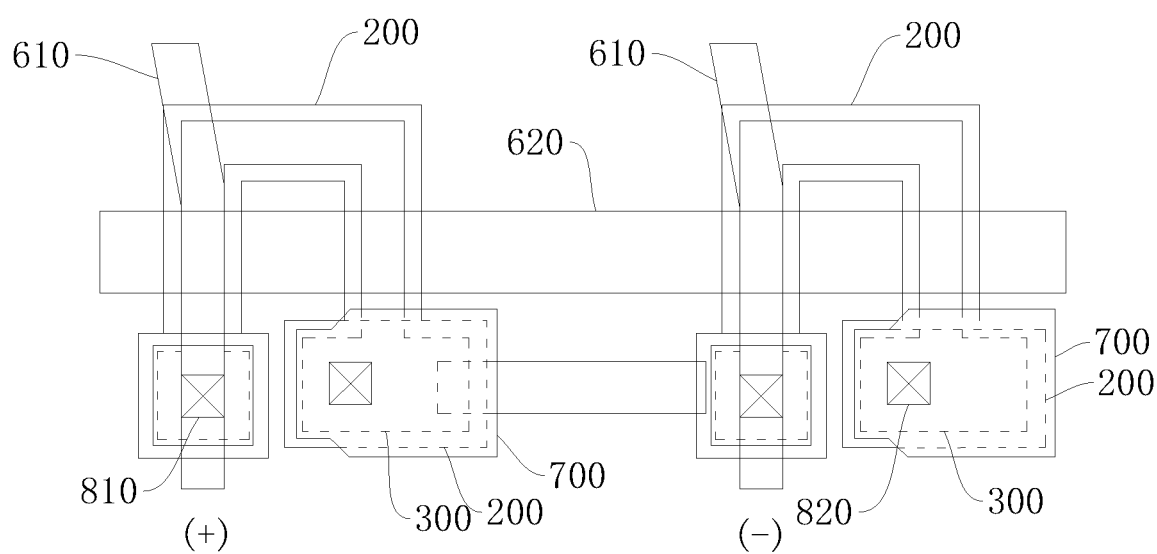
FIG. 1 is a schematic structural plan view of a conventional active layer and conventional light shielding layer.

REFERENCE CHARACTERS underlay 100, light shielding portions 200, active portions 300, first active portion 301, second active portion 302, first doping region 310, channel region 320, second doping region 330, bridge element 400, first insulation layer 510, second insulation layer 520, third insulation layer 530, signal lines 600, data line 610, scan line 620, pixel electrode layer 700, source and drain electrode layer 800, first source and drain electrode portion 810, second source and drain electrode portion 820, gate electrode layer 900.

DETAILED DESCRIPTION OF PREFERRED EMBODIMENTS

The technical solution in the embodiment of the present application will be clearly and completely described below with reference to the accompanying drawings in the embodiments of the present application. Apparently, the described embodiments are merely some embodiments of the present application instead of all embodiments. According to the embodiments in the present application, all other embodiments obtained by those skilled in the art without making any creative effort shall fall within the protection scope of the present application. In addition, it should be understood that the specific embodiments described here are only used to illustrate and explain the present application, and are not used to limit the present application. In the present application, the used orientation terminologies such as "upper" and "lower", when are not specified to the contrary explanation, usually refer to the upper and lower states of the device in actual use or working conditions, specifically according to the direction of the figures in the drawings. Furthermore, "inner" and "outer" refer to the outline of the device.

A low frequency display technology has become a development focus of current display technologies because of improvement of endurance of display apparatus. To mitigate an issue of off-state leakage current of a thin film transistor in a low frequency display, usually two thin film transistors in series connection with an active layer are disposed in a sub-pixel to increase a ratio of channel region to further increase, an impedance value of the thin film transistors. Furthermore, a metal light shielding layer is disposed to shield channel regions of thin film transistors to achieve a goal of reducing an off-state leakage current the thin film transistors. In the meantime, to reduce a coupling capacitor between a metal light shielding layer and data lines on an array substrate to prevent an issue of low frequency flickering, a conventional way is to connect metal light shielding layers of two or more of sub-pixels together, to use inverted polarities of adjacent two data lines to effectively offset flickering deterioration due to the coupling capacitor to reach an effect of improvement of low frequency flickering.

However, metal light shielding layers corresponding to two or a plurality of sub-pixel are connected, as shown in FIG. 1, which is equivalent to increase an area of the metal light shielding layer. Furthermore, a large piece of the metal layer would result in an issue of poor static electricity protection process. For solving this issue, usually metal light shielding layers corresponding to sub-pixels are spaced from one another, and metal light shielding layer corresponding to two thin film transistors in series connection are also spaced to reduce an area of the single metal light shielding layer to further reduce the issue of poor static electricity protection process.

However, the active layer of two thin film transistors in series connection has climbing in spaced positions of the metal light shielding layer, and the climbing positions easily causes abnormal crystallization or broken parts of the active layer, which results in drastic decrease of a on-state current of a thin film transistor to result in poor display such as dark points. The present application, based on the above technical issue, sets forth solutions as follows.

Figure 2:
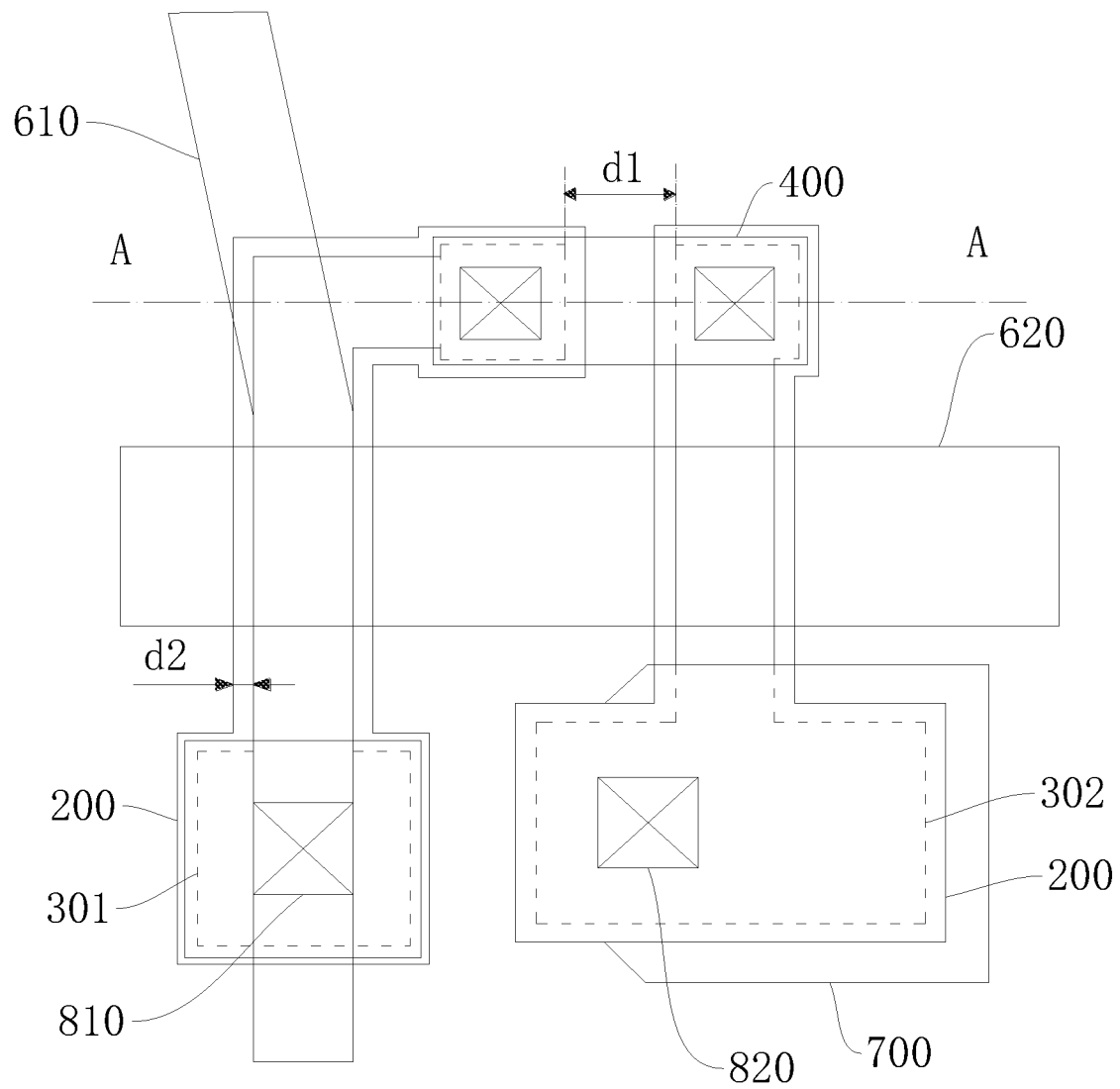
FIG. 2 is a schematic structural plan view of an active layer and a light shielding layer of an array substrate of the present application.
Figure 3:
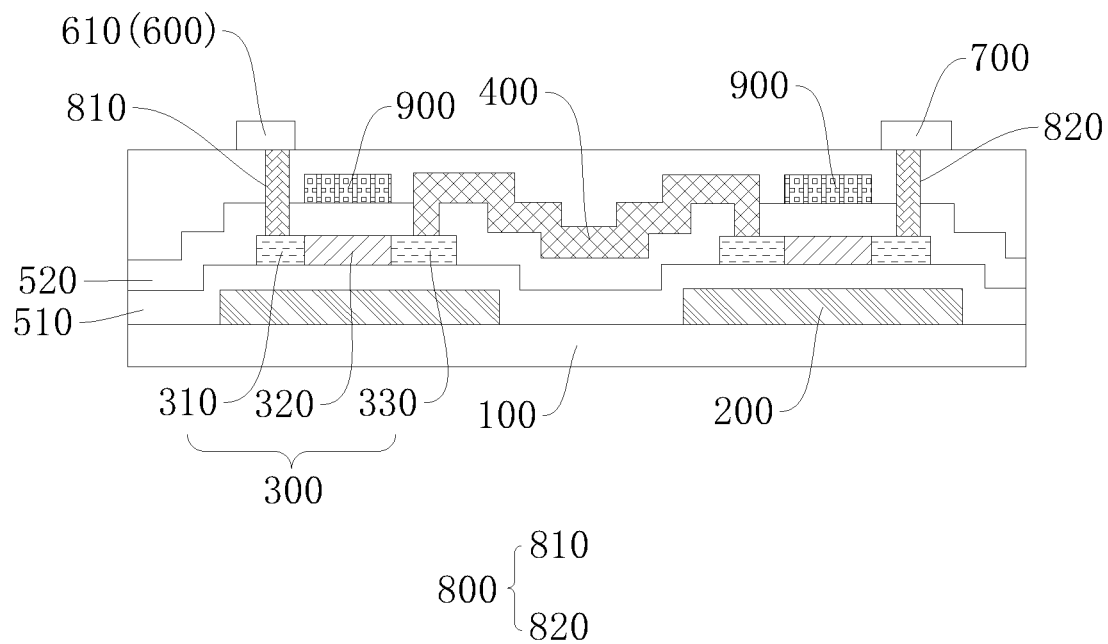
FIG. 3 is a first cross-sectional view of the array substrate of the present application along line AA in FIG. 2.
Figure 4:
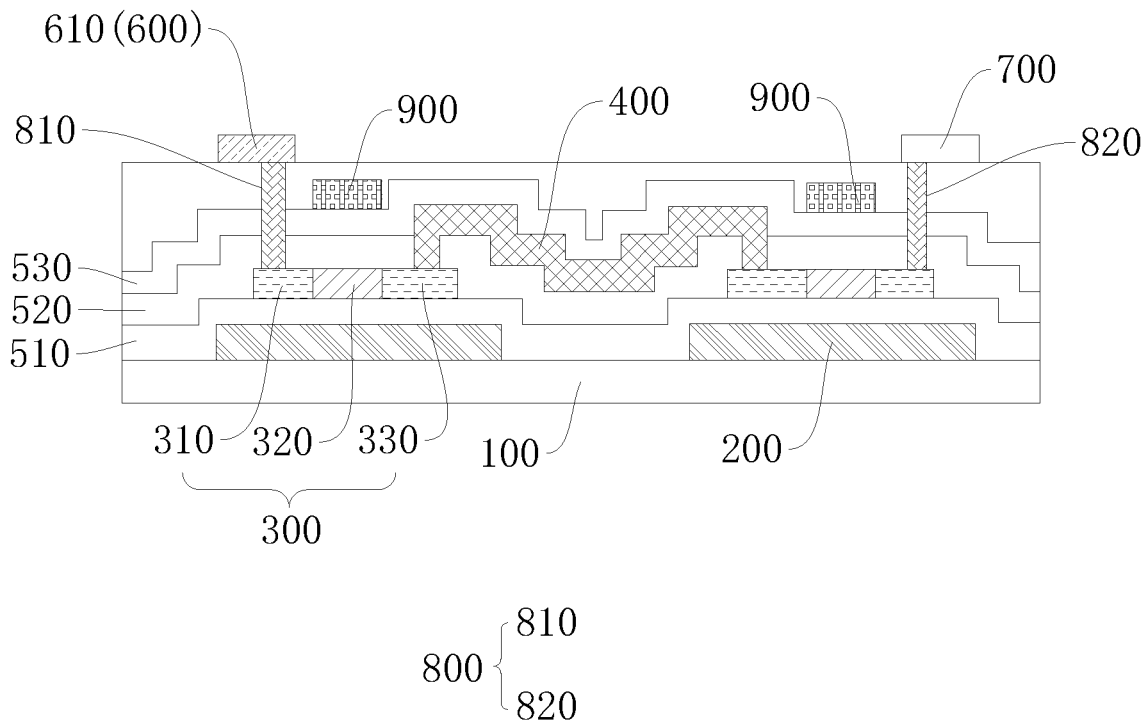
FIG. 4 is a second cross-sectional view of the array substrate of the present application along line AA in FIG. 2.

With reference to FIGS. 2 to 4, the present application provides an array substrate, comprising:

an underlay 100;

a light shielding layer disposed on the underlay 100, wherein the light shielding layer comprises a plurality of light shielding portions spaced from one another 200;

an active layer disposed on the light shielding layer, wherein the active layer comprises a plurality of active portions spaced from one another 300, and the active portions 300 corresponding to the light shielding portions 200; and a bridge element 400 disposed on the active layer, wherein adjacent two of the active portions 300 are electrically connected to each other through the bridge element 400, and a toughness of the bridge element 400 is greater than a toughness of the active portions 300.

The present application disposes a bridge element 400 connected to adjacent two active portions 300 to make the active portions 300 of the adjacent two thin film transistor in series connection such that a ratio of a channel region 320 in two thin film transistors in series connection can be improved to further improve an impedance value and reduce an off-state leakage current of the thin film transistor. Furthermore, in the present application, the light shielding portions 200 corresponding to the adjacent two of the active portions 300 are also spaced, which can solve or mitigate the issue of a large piece of a metal layer resulting in a poor static electricity protection process. Furthermore, in the present application, a toughness of the bridge element 400 is greater than a toughness of the active portions 300 such that the climbing position between adjacent two of the light shielding portions 200 can keep continuous to lower a risk of abnormal crystallization or broken parts of "active layer" of the climbing position to further prevent or mitigate a probability of drastic decrease of an on-state current of the thin film transistor and reduce poor display such as dark points.

The technical solution of the present application is described with specific embodiments now. It should be explained that a description order of the following embodiments has no limit to a preferred order of the embodiments.

In the array substrate of the present application, the underlay 100 can be a glass substrate or a polyimide substrate.

In the present embodiment, the light shielding layer can be metal layer, for example, conductive metal such as copper, aluminum, molybdenum, titanium, etc. or alloy material.

In the present embodiment, the active layer can be manufactured by a low-temperature poly-silicon (LTPS) material.

In the present embodiment, the active portions 300 of the active layer are arranged in an array, and each adjacent two of the active portions 300 are connected through the bridge element 400 to form an active structure in series connection of the thin film transistor for driving/controlling a sub-pixel to work.

In the present embodiment, the bridge element 400 can be manufactured by a conductive metal with a greater toughness compared to a low-temperature poly-silicon material, for example, metal such as aluminum, silver, copper, etc. or an alloy material, such that a climbing position of the bridge element 400 between adjacent two of the light shielding portions 200 is difficult to break, and no crystallization anomaly phenomenon exists to reduce abnormal display such as dark points.

In the array substrate of the present application, the array substrate can further comprise a first insulation layer 510 disposed between the light shielding layer and the active layer and a second insulation layer 520 disposed between a the active layer and the bridge element 400. In the present embodiment, the first insulation layer 510 and the second insulation layer 520 can be manufactured by an inorganic insulative material such as $SiN_x$ or $SiO_x$.

With reference to FIG. 2, FIG. 2 is a schematic structural plan view of the active layer and the light shielding layer of the array substrate of the present application. In the array substrate of the present application, the interval d1 of adjacent two of the active portions 300 connected through the bridge element 400 is 2 microns to 5 microns. In the present embodiment, adjacent two of the active portions 300 connected to the bridge element 400 are the two active portions 300 connected in series in one sub-pixel. namely, an interval of two active portions 300 connected in series in one sub-pixel is 2 microns to 5 microns such that a suitable interval is kept between the active portion 300 and a corresponding one of the light shielding portions 200 to prevent or mitigate an issue of an over small interval of the light shielding portions 200 resulting in a shoring issue to further cause a poor static electricity protection (electrostatic discharge, ESD) process, or prevent or mitigate an issue of the over large interval of the active portions 300 resulting in increase of an area of the pixel and decrease of a resolution of the display panel.

With reference to FIG. 2, In the array substrate of the present application, an orthographic projection of the active portions 300 on a corresponding one of the light shielding portions 200 is located in the light shielding portions 200 such that the light shielding portions 200 can sufficiently shield the channel regions 320 of the active portions 300 to prevent light from irradiating the channel regions 320 of the active portions 300 to further lower the light leakage current of the channel regions 320.

It should be explained that in the present embodiment, an orthographic projection of the active portions 300 on the light shielding layer is completely located in a corresponding one of the light shielding portions 200. Therefore, in each of the active portions 300, no climbing issue due to some positions corresponding to the light shielding portions 200 and some other positions corresponding to no light shielding portion 200 exists such that an issue of abnormal crystallization or broken parts in each of the active portions 300 does not exist, which further reduces abnormal display such as dark points.

In the present embodiment, in a top view plane of the array substrate, an interval d2 between an edge of the active portion 300 and an edge of the light shielding portion 200 is 1 micron to 3 microns. In other words, in a top view plane of the array substrate, a width of a portion of the edge of the light shielding portion 200 exceeding the edge of the active portions 300 is 1 micron to 3 microns. The present embodiment, by the above configuration, makes the light shielding portions 200 sufficiently shield corresponding ones of the active portions 300 and makes the light shielding portions 200 corresponding to two the active portions 300 in series connection in one pixel keep a suitable interval to prevent or mitigate an issue of an over small interval of the light shielding portions 200 resulting in a shoring issue to further cause a poor static electricity protection (electrostatic discharge, ESD) process, or prevent or mitigate an issue of the over large interval of the active portions 300 resulting in increase of an area of the pixel and decrease of a resolution of the display panel.

With reference to FIG. 3, FIG. 3 is a first cross-sectional view of the array substrate of the present application along line AA in FIG. 2. In the array substrate of the present application, in a direction perpendicular to the array substrate, a thickness of the bridge element 400 is greater than a thickness of the light shielding layer such that the bridge element 400, on the basis of a material with an excellent toughness, further improves pull/tear resistance itself by increasing a thickness to more stably connect the two active portions 300 in series.

In the present embodiment, a thickness of the light shielding layer can be 700 Å to 800 Å, namely, can be 70 nm to 80 nm.

In the present embodiment, a thickness of the bridge element 400 can be greater than 4000 Å, namely, can be greater than 400 nm.

With reference to FIG. 3, In the array substrate of the present application, the active portions 300 can comprise a channel region 320 and a first doping region 310 and a second doping region 330 located between two sides of the channel region 320. The bridge element 400 is connected to the first doping region 310 and the second doping region 330 of adjacent two of the active portions 300.

In the present embodiment, in adjacent two of the active portions 300 connected to the bridge element 400, the interval between the first doping region 310 of one of the active portions 300 and the second doping region 330 of another of the active portions 300 is 2 microns to 5 microns. Furthermore, the bridge element 400 in this interval connects the first doping region 310 of one of the active portions 300 to the second doping region 330 of another one of the active portions 300.

The present embodiment, by the above configuration, can connect the bridge element 400 to adjacent two of the active portions 300 in a nearest position. On one hand, a material cost of the bridge element 400 is reduced, on the other hand, it is advantaged for decreasing a climbing span between adjacent two active portions 300 to improve bridging stability of the bridge element 400.

With reference to FIG. 3, In the array substrate of the present application, the array substrate can further comprise a plurality of signal lines 600 and a pixel electrode layer 700 disposed on the active layer. The active layer at least comprises a first active portion 301 and a second active portion 302 adjacent to each other. The signal lines 600 is connected to the first active portion 301 through a via hole, and the second active portion 302 is connected to the pixel electrode layer 700 through a via hole.

In the present embodiment, the first active portion 301 and the second active portion 302 are active structures in series connection through the bridge element 400 in the same sub-pixel. In the present embodiment, the signal lines 600 can be data lines 610, signals in the data lines 610 passes through the first active portion 301, the bridge element 400, the second active portion 302, and then are transmitted to the pixel electrode layer 700 through via holes to achieve a signal driving function to the array substrate.

The array substrate can further comprise a source and drain electrode layer 800 disposed on the active portions 300, the source and drain electrode layer 800 can comprise a first source and drain electrode portion 810 disposed on the first doping region 310 of the first active portion 301 and a second source and drain electrode portion 820 disposed on the second doping region 330 of the second active portion 302. The signal line 600 is connected to the first source and drain electrode portion 810 through the via hole. The bridge element 400 connects the second doping region 330 of the first active portion 301 to the first doping region 310 of the second active portion 302. The second source and drain electrode portion 820 of the second active portion 302 is connected to the pixel electrode layer 700 through a via hole.

The present embodiment, by the above configuration, achieve driving control of two thin film transistors in series connection to the same sub-pixel. Furthermore, because the channel region 320 of the two the active portions 300 in series connection has a greater length and a higher impedance, it can more effectively reduce the off-state leakage current of the thin film transistor to further mitigate the issue of low frequency flickering.

With reference to FIGS. 3 and 4, FIG. 4 is a second cross-sectional view of the array substrate of the present application along line AA in FIG. 2. In the array substrate of the present application, the array substrate can further comprise a gate electrode layer 900 disposed on the active layer. An orthographic projection of the channel region 320 of the active portions 300 on the gate electrode layer 900 is located in the gate electrode layer 900. In the present embodiment, the gate electrode layer 900 can comprise a plurality of gate electrode portions spaced from one another, the gate electrode portions correspond to the active portions 300 one by one, namely, an orthographic projection of the channel region 320 of each of the active portions 300 on a corresponding one of the gate electrode portions is located in gate electrode portions such that the gate electrode portions can perform a shielding function while doping the active portions 300 to further form a non-doped channel region 320.

In the present embodiment, the array substrate can further comprise multiple scan lines 620, disposed on the active layer. The multiple scan line 620 perpendicularly intersect the multiple data lines 610. The scan line 620 and the data line 610 can be a conductive metal line. In the present embodiment, the gate electrode portions in a certain row or a certain column can be commonly connected to a data line 610 to achieve synchronized gate electrode driving.

In the present embodiment, the bridge element 400 is connected to the adjacent two of the active portions 300 through a via hole. In particular, a first end of the bridge element 400 passes through the via hole and downwardly extends into the second doping region 330 of the first active portion 301. A second end of the bridge element 400 passes through the via hole and downwardly extends into the first doping region 310 of the second active portion 302. A middle portion of the bridge element 400 performs climbing in an interval between adjacent two of the light shielding portions 200 such that the bridge element 400 forms a bridge structure with two higher ends and a lower middle.

In the present embodiment, as shown in FIG. 3, the second insulation layer 520 can be a gate insulation layer disposed between the active layer and the gate electrode layer 900. The gate electrode layer 900 and the bridge element 400 can be disposed on the same layer to reduce a film layer thickness of the array substrate to achieve light weight and thinness.

In the present embodiment, as shown in FIG. 4, the gate electrode layer 900 can also be located on the active layer and the gate electrode layer 900 and the bridge element 400 are disposed in different layers. At this time, a third insulation layer 530 disposed between the gate electrode layer 900 and the bridge element 400 is required for achievement of insulation. The third gate insulation layer can be manufactured by an inorganic insulative material such as $SiN_x$ or $SiO_x$.

The present application disposes a bridge element 400 connected to adjacent two active portions 300 and connects the active portions 300 of adjacent two thin film transistors in series such that a ratio of channel region 320 of two thin film transistors in series connection can be increased to increase an impedance value and reduce an off-state leakage current of the thin film transistor. Furthermore, light shielding portions 200 corresponding to adjacent two of the active portions 300 in the present application are also spaced from one another, which can solve an issue of a large piece of a metal layer resulting in a poor static electricity protection process. Furthermore, in the present application, a toughness of the bridge element 400 is greater than a toughness of the active portions 300 such that the climbing position between adjacent two of the light shielding portions can keep continuous to lower a risk of abnormal crystallization or broken parts of "active layer" of the climbing position to further prevent or mitigate a probability of drastic decrease of an on-state current of the thin film transistor and reduce poor display such as dark points.

The embodiment of the present application also provides a display terminal, the display terminal can comprise a terminal main body and the array substrate. The array substrate and the terminal main body are assembled integrally.

The array substrate and the display terminal provided by the embodiment of the present application are described in detail as above. In the specification, the specific examples are used to explain the principle and embodiment of the present application. The above description of the embodiments is only used to help understand the method of the present application and its spiritual idea. Meanwhile, for those skilled in the art, according to the present the idea of invention, changes will be made in specific embodiment and application. In summary, the contents of this specification should not be construed as limiting the present application.

What is claimed is:

1. An array substrate, comprising:
   an underlay;
   a light shielding layer disposed on the underlay, wherein the light shielding layer comprises a plurality of light shielding portions spaced from one another;
   an active layer disposed on the light shielding layer, wherein the active layer disposed on a plurality of active portions spaced from one another, the active portions correspond to the light shielding portions; and
   a bridge element disposed on the active layer, wherein adjacent two of the active portions are electrically connected to each other through the bridge element, a toughness of the bridge element is greater than a toughness of the active portions;
   wherein an orthographic projection of the active portion on a corresponding one of the light shielding portions is located fully within the light shielding portion;
   wherein in a direction perpendicular to the array substrate, a thickness of the bridge element is greater than a thickness of the light shielding layer;
   wherein the thickness of the bridge element is greater than 4000 Å.

2. The array substrate according to claim 1, wherein an interval between adjacent two of the active portions connected through the bridge element is 2 microns to 5 microns.

3. The array substrate according to claim 1, wherein in a top view plane of the array substrate, an interval between an edge of the active portion and an edge of the light shielding portion is 1 micron to 3 microns.

4. The array substrate according to claim 1, wherein the active portion comprises a channel region and a first doping region and a second doping region located on two sides of the channel region.

5. The array substrate according to claim 4, wherein the bridge element is connected to the first doping region and the second doping region of adjacent two of the active portions.

6. The array substrate according to claim 4, wherein the array substrate further comprises signal lines and a pixel electrode layer disposed on the active layer.

7. The array substrate according to claim 6, wherein the active layer at least comprises a first active portion and a second active portion that are adjacent to each other.

8. The array substrate according to claim 7, wherein the signal line is connected to the first active portion through a via hole.

9. The array substrate according to claim 8, wherein the second active portion is connected to the pixel electrode layer through a via hole.

10. The array substrate according to claim 6, wherein the array substrate further comprises a first source and drain electrode portion disposed on the first doping region of the first active portion.

11. The array substrate according to claim 10, wherein the array substrate further comprises a second source and drain electrode portion disposed on the second doping region of the second active portion.

12. The array substrate according to claim 11, wherein the signal line is connected the first source and drain electrode portion to through a via hole.

13. The array substrate according to claim 12, wherein the bridge element is connected to the second doping region of the first active portion and the first doping region of the second active portion.

14. The array substrate according to claim 4, wherein the array substrate further comprises a gate electrode layer disposed on the active layer.

15. The array substrate according to claim 14, wherein the active portions an orthographic projection of the channel region on the gate electrode layer is located in the gate electrode layer.

16. The array substrate according to claim 1, wherein the array substrate further comprises a gate insulation layer disposed between the active layer and the bridge element.

17. The array substrate according to claim 16, wherein the bridge element is connected to the active layer through a via hole.

18. A display terminal, comprising a terminal main body and the array substrate according to claim 1, wherein the array substrate and the terminal main body are assembled integrally.

* * * * *